United States Patent [19]
Oisel et al.

[11] Patent Number: 4,566,105
[45] Date of Patent: Jan. 21, 1986

[54] CODING, DETECTING OR CORRECTING TRANSMISSION ERROR SYSTEM

[75] Inventors: André Oisel, Elancourt; Abdelhamid Boulenouar, Les Ulis; Denise Le Gleau, Paris, all of France

[73] Assignee: Cii Honeywell Bull (Societe Anonyme), Paris, France

[21] Appl. No.: 531,680

[22] Filed: Sep. 13, 1983

[30] Foreign Application Priority Data

Sep. 13, 1982 [FR] France .................................. 82 15403

[51] Int. Cl.⁴ ............................................. G06F 11/10
[52] U.S. Cl. ....................................................... 371/37
[58] Field of Search ........................ 371/37, 38, 39, 40

[56] References Cited
U.S. PATENT DOCUMENTS 3,562,711 2/1971 Davis et al. ............................ 371/37
4,450,561 5/1984 Gotze et al. ........................... 371/37

Primary Examiner—Charles E. Atkinson
Attorney, Agent, or Firm—Lowe, King, Price & Becker

[57] ABSTRACT

Transmission errors in an interlaced Reed-Solomon cyclically coded binary message are detected and corrected. The message is coded and decoded by a system including several serially connected shift register assemblies. The first register of the first assembly receives the message data. The number of register assemblies equals the degree of a polynomial that controls the code. The number of registers in each assembly equals the interlacing depth of the code. Feedforward circuits between the register assemblies include matrices for obtaining the coefficients of the polynomial of the cyclic code. These coefficients are obtained based on the prime elements of a Galois group.

29 Claims, 10 Drawing Figures

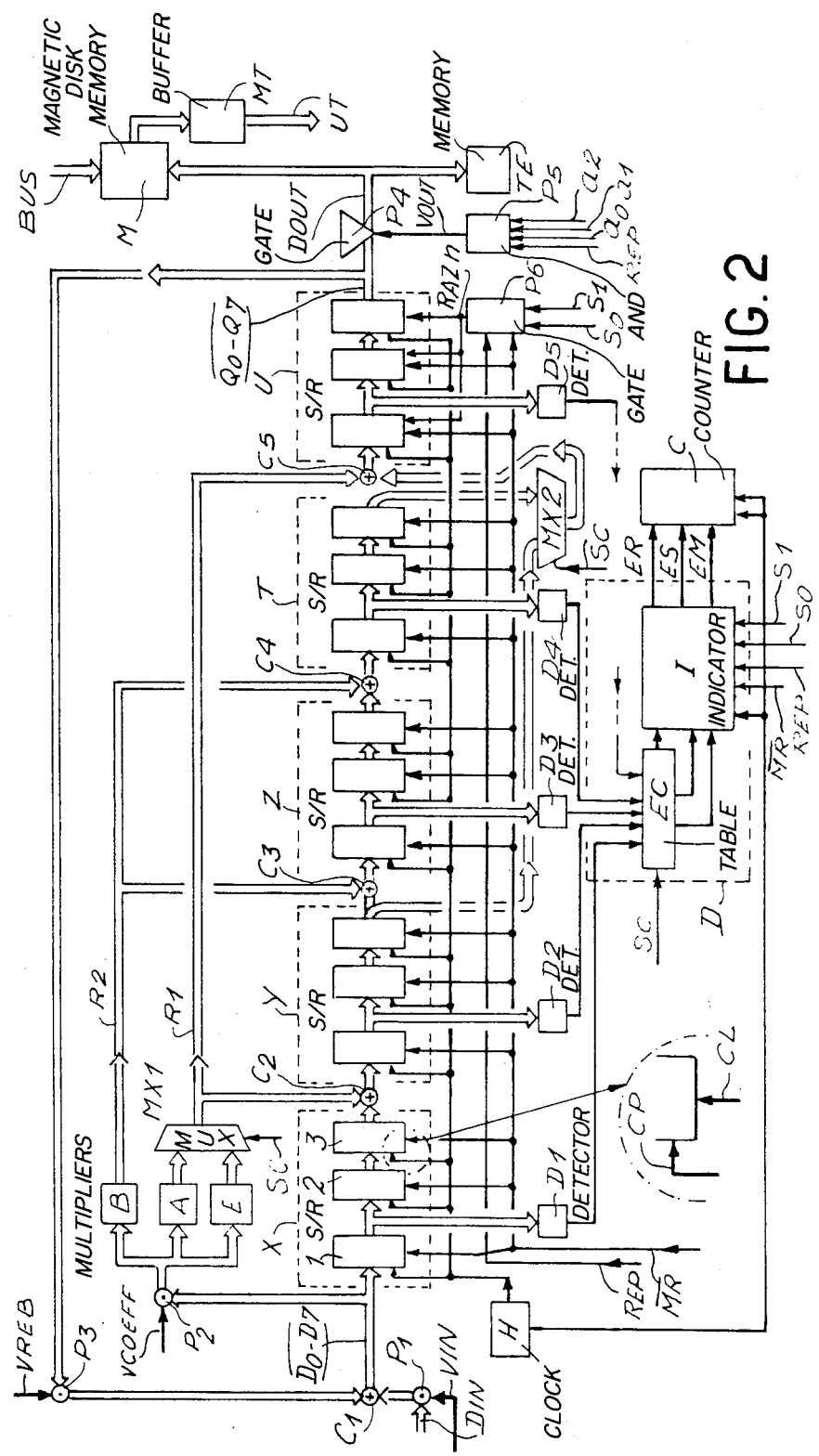

MATRIX A

| | | | | | | | |
|---|---|---|---|---|---|---|---|
| D0 → 0 | 1 | 0 | 0 | 1 | 0 | 0 | 0 |
| D1 → 1 | 0 | 0 | 1 | 0 | 0 | 0 | 0 |
| D2 → 0 | 0 | 0 | 0 | 1 | 1 | 1 | 0 |
| D3 → 0 | 0 | 0 | 1 | 1 | 0 | 1 | 0 |
| D4 → 0 | 0 | 1 | 1 | 0 | 1 | 0 | 0 |
| D5 → 0 | 1 | 1 | 0 | 1 | 0 | 0 | 0 |
| D6 → 1 | 1 | 0 | 1 | 0 | 0 | 0 | 0 |
| D7 → 1 | 0 | 0 | 0 | 1 | 1 | 0 | 1 |

↓ ↓ ↓ ↓ ↓ ↓ ↓ ↓
⊕ ⊕ ⊕ ⊕ ⊕ ⊕ ⊕ ⊕
A7 A6 A5 A4 A3 A2 A1 A0

MATRIX B

| | | | | | | | |
|---|---|---|---|---|---|---|---|
| D0 → 0 | 0 | 0 | 0 | 0 | 1 | 0 | 0 |
| D1 → 0 | 0 | 0 | 0 | 1 | 0 | 0 | 0 |
| D2 → 0 | 0 | 0 | 1 | 0 | 0 | 0 | 0 |
| D3 → 0 | 0 | 1 | 0 | 0 | 0 | 0 | 0 |
| D4 → 0 | 1 | 0 | 0 | 0 | 0 | 0 | 0 |
| D5 → 1 | 0 | 0 | 0 | 0 | 0 | 0 | 0 |
| D6 → 0 | 0 | 1 | 0 | 1 | 1 | 0 | 1 |
| D7 → 0 | 1 | 0 | 1 | 1 | 0 | 1 | 0 |

ERROR TABLE - Interlacing by 3

| NUMBER OF ERRORS DECODED | POSSIBLE INTERPRETATIONS |
|---|---|
| 6 | 3 grouped double errors |
| 5 | 2 grouped double errors + 1 single error |
| 4 | 2 grouped double errors _or_ 1 grouped double error + 2 single errors |
| 3 | 3 single errors _or_ 1 grouped double error + 1 single error |
| 2 | 1 grouped double error _or_ 2 single errors |
| 1 | 1 single error |

CODING, DETECTING OR CORRECTING TRANSMISSION ERROR SYSTEM

TECHNICAL FIELD

The present invention relates to a system employing a cyclic, error-autocorrecting code of the interleaved Reed-Solomon type for detecting and correcting data transmission errors and more particularly to a system including a serial-parallel bit feedback shift register having binary multiplication circuits responsive to multiplying coefficients and to a signal from the register.

The invention applies to detection and correction of errors which may arise during transmission of data among various components of a data processing system. More specifically, it applies to detecting and correcting data transmission errors between a central processing unit and peripheral units, such as very high-density magnetic discs.

BACKGROUND ART

The need to detect and correct errors in data transmitted between components, i.e., units, of a data processing system is acknowledged. In general, when message data are transmitted between units, the data are encoded such that transmission errors can be detected and possibly corrected by decoding at the receiving end. Errors may also occur when a coded message is recorded in a storage unit, such as magnetic disc, or when a recorded message code is read. Various systems, employing various self-correcting codes, exist for detecting and correcting data transmission errors.

The major existing error detecting and correcting codes are the block, systematic, algebraic, external, internal, linear, cyclic, binary and truncated. The block code is used when data to be stored, for example, on a magnetic disc, are organized into blocks of K symbols of a given length. A typical value of k is 256, for instance, for blocks that are each one byte in length. The block code changes the useful logic block into a logic block having a length of n·k (where n is an integer >- than k). The block contains redundant characters for enabling detection and correction of a certain number of errors in stored data read from the disc. The systematic code is formed by concatenating a useful block of k length with a redundant character of r length, wherein the total length of the redundancy checkwork is $n = k + r$ symbols.

In the algebraic code, coding and decoding are based on an algorithm which is usually defined by a series of simple calculations. The external code is a coding technique defined above which operates on relatively long data blocks. The external code is usually programmed into a control unit or into the magnetic disc. In the internal code, techniques are employed to transform a series of logic data into a signal which can be written onto a disc. The internal code is also known as a modulation or a recording code, normally performed bit by bit, or on a relatively small number of bits (a few or a few dozen bits). In other words, the code words of the internal code are extremely short. A code word in the external code is therefore composed of a series of internal code words.

A code is said to be linear when an error configuration $E_1$ is translated by a syndrome $S_1$, an error configuration $E_2$ is translated by a syndrome $S_2$, and the error configuration $E_1 + E_2$ is translated by syndrome $S_1 + S_2$. The syndrome is defined below. A cyclic code produces a new code word by cyclic permutation of a set of symbols forming one code word. A code is said to be binary when isolated bits are the elementary symbols on which the algorithm of the code operates. These elementary symbols can be characters of an "alphabet" having more than two elements, in which case the code is called "non-binary" code. However, each character may be represented by a number of bits. The distinction is necessary mainly to correctly define properties of the code. In a truncated code, the total effective length of the protected block (data+key or checkword) is less than the natural period of the cyclic code or the interleaving period.

In general, only minimal additional complexities arise from truncation. In defining the properties of a code, it is usually sufficient to consider that the truncated section consists of fictitious zeroes. The only drawback to truncation is the additional time which may be required to examine the truncated section, when the decoding algorithms are performed, but there are methods for overcoming this drawback.

A number of definitions relating to error correction are now provided.

Error syndrome:

An error syndrome, or "syndrome" is the first result of processing a coded block during decoding. The syndrome length is always equal to the key or checkword length. In the absence of read errors, the syndrome is zero, so that the validity of the block can easily be determined. In the presence of errors, the syndrome reflects the error configuration and enables detection and correction of the error(s) within certain limits. In general, the produced errors cannot be recognized directly in the syndrome and error identification requires additional processing, i.e. decoding of a more or less complex nature.

Miscorrection:

When an error configuration results in transforming one code word into another code word, or into a sequence of symbols close to another code word, the result is miscorrection without the operator's knowledge. The ability of a code to avoid miscorrection is an essential property thereof. However, this ability is never absolute. The probability of miscorrection depends on the selected code, on the redudancy thereof, on the correction/detection compromise, and on the natural statistics of the errors affecting the message received.

Residual error:

Residual errors are caused by an error which has not been detected or from those errors which are miscorrected.

Error propagation:

Miscorrection normally causes the original errors to remain and to be compounded by new errors in the block. An error propagation phenomenon is thus produced, and can affect the total length of a code word. This condition can be produced in both the external and the internal code. It can result in a condition wherein the logic errors to be processed by the external code are longer than the physical errors which produced them.

The most frequently used error detection codes are cyclic codes. Error detection is the primary application of the cyclic codes which are widely employed. Error detection involves using a redundant key or redundancy checkword concatenated to the message (systematic code) during transmission and reception in telecommunications systems or during reading from a memory. For error detection, a relatively short key (a few bytes) can be used for relatively long blocks (several thousand bytes). The key or checkword enables a received message to be sorted into two categories, viz: (1) messages which exactly match one code word, in which case it is assumed there are no errors; and (2) the remaining messages which do not match any code word; in this case, the existence of one or more errors is a certainty. In general, cyclic codes are used only for error detection; the errors are not corrected on the basis of information provided by the redundancy. The message is retransmitted in telecommunications systems or reread from magnetic memories.

The process of error detection using a cyclic code is simple (requiring little hardware), efficient (low redundancy), and powerful (information can be retrieved, at least if only random errors are present). However, this process is defective in three cases, viz: (1) when permanent errors exist, which is rarely the case in telecommunications but frequently occurs in high-density recording systems, due to physical defects on the recording medium; (2) when the message cannot be retransmitted due to time factors (e.g., in space communications); and (3) when a significant error transforms one code word into another code word and the error is not detected. Cyclic codes can overcome these disadvantages if the error configuration remains in reasonable limits; if a checkword of sufficient length is added to the data block, this redundancy can be used to correct errors.

The Hamming code is the simplest one-bit correction code of the most frequently used cyclic codes. A disadvantage of the Hamming code is that if the error is greater than one bit, the syndrome is still corrected as a one-bit error which is usually different from each of the bits which form the actual error configuration. This disadvantage produces miscorrection. Adding a parity bit improves this situation because a parity bit enables a corrected one-bit error to be distinguished from a two-bit error, which is detected but not corrected.

Generally speaking, cyclic codes provide for very simple error detection and correction whenever the data to be protected are in the form of long sequential chains, as is the case is telecommunications and magnetic memory systems, but not the case in random access memories.

All transcoding calculations required to generate the checkwords (systematic codes) or relatively short syndromes (low redundancy rate) can be performed using a conventional sequential cable system which comprises a serial or serial-parallel shift register having a number of flip-flops equal to the number of redundant bits forming the checkword in combination with a number of "EXCLUSIVE OR" gates, and feedback circuits looping on intermediary stages which introduce a "perturbation" element for generating cyclic phenomena over much longer periods than the checkword length. This extremely simple sequential structure is very easy to manufacture on a large scale as a single integrated circuit.

DISCLOSURE OF INVENTION

The object of the invention is to provide an apparatus for detecting and correcting data transmission errors, which employs a cyclic, Reed-Solomon error-autocorrecting code for obviating the disadvantages of conventional systems that employ other types of cyclic codes; these disadvantages have been reviewed above and arise primarily because no simple system provides for simultaneous detection and correction of burst errors, or for detection and correction of multiple errors dispersed within a coded message. For example, systems which use a Hamming code can be used to detect a single or double-bit error, but can only correct the single-bit error.

An advantage of the system according to the invention lies primarily in the use of a Reed-Solomon code, which has the following essential properties:

(1) it is a non-binary code; that is, it operates on elementary data which are symbols and not isolated bits. These symbols may be extracted from a binary alphabet, that is, they may be coded on m bits.

(2) it displays an "optimal logic distance", that is, it provides the best performance (correction/detection compromise), for a given redundancy, relative to other codes based on other criteria. The notion of logic distance is defined below.

(3) it operates in a relatively short period which is related to the length (m) of the characters by a very strict relationship. This limits the range of possible choices to protect a block of a given length.

(4) if the code parameters are correctly set, the code enables correction of multiple errors. This code is far superior to conventional codes due to its flexibility in adaptation to related signal processing techniques. This code is the simplest solution to processing complex error conditions.

(5) it provides the best solution to the problem of error processing in high-density recording devices, such as magnetic tapes, magnetic discs, digital optical discs.

The object of the invention is to provide an apparatus for coding, detecting and correcting errors in a binary message, which apparatus employs a cyclic code of the interlaced Reed-Solomon type. The message is composed of at least one useful sub-block of symbols respectively displaying the same number of data bits, and the number of sub-blocks corresponds to the interleaving depth of the code. The system comprises several successive cascaded shift register assemblies having parallel inputs and outputs, and responsive to a shift command clock. Each register has a number of inputs and outputs equal to the number of data bits in each symbol wherein the number of shift registers in each assembly is equal to the interleaving depth of the code. The number of register assemblies depends on the degree of a polynomial which generates a cyclic code selected during initialization. The first register in the first register assembly receives, one by one, the symbols of a message to be coded. It combines a command checkword obtained by concatenation with the useful symbols in the message, or receives the words of a coded message which contains a key and may include erroneous bits to be detected and corrected.

The system additionally comprises an "EXCLUSIVE OR" adder having outputs which are respectively connected to the inputs of the first register of the first assembly. Inputs of the EXCLUSIVE OR adder are respectively connected to the outputs of the last register of the last assembly of said group of assemblies and to be responsive to data from each of the symbols of the message. The system includes other intermediate "EXCLUSIVE OR" adders having inputs and outputs respectively connected to the outputs and inputs of the successive assemblies of said group of assemblies; other inputs of these intermediary adders are respectively connected by feedback circuits to the outputs of the last register of the last assembly. The apparatus is characterized by the fact that the feedback circuits respectively comprise matrices for obtaining the coefficients of a polynomial which generates the cyclic mode of the message. The obtained coefficients are based on the primitive elements of a predetermined Galois field, and stored in each matrix. Outputs of these matrices apply binary numbers representing the products of the coefficients of the polynomial and the outputs of the last register of the last assembly to the other inputs of the intermediate adders.

According to another characteristic of the invention, the first feedback circuit comprises another matrix for obtaining the coefficients of another polynomial which generates a cyclic interleaved Reed-Solomon code of the message, wherein the outputs of the matrices of this first feedback circuit are connected to the inputs of one multiplexer, having outputs which are connected to the inputs of the intermediate adders corresponding to this first feedback circuit. The system additionally comprises another multiplexer, having inputs and outputs respectively connected to outputs of certain of the successive assemblies and to the inputs of the adder corresponding to the last assembly. The connection of outputs of certain of the assemblies to the inputs of the second multiplexer depends on the code selected through a selection signal applied to this multiplexer.

According to a further characteristic of the invention, the matrices for obtaining the coefficients of the polynomial which generates the cyclic code of the message have inputs for receiving the data and outputs which are connected by corresponding feedback circuits to the inputs of the intermediate adders. The outputs of these matrices are either directly connected with the inputs of these matrices, or control EXCLUSIVE OR gates which receive some of the data. In the latter situation, the number of gate inputs is minimized by the choice of the primitive polynomial (among 16 prime polynomials) which generates the Galois field elements, and the choice of a primitive element of this field.

According to a further characteristic of the invention, the apparatus additionally comprises logic circuitry for selecting the operating mode of the system. The logic circuitry comprises a first group of "AND" gates, equal to the number of bits in each symbol of a message. Each of the AND gates has first and second sets of inputs respectively responsive to the data from each word and a validation signal, for selectively enabling encoding of a message. The outputs of these gates are respectively connected to the inputs of the first "EXCLUSIVE OR" adder. The logic circuitry comprises a second group of AND gates, equal to the number of data bits in each word. Each gate of the second group has a first and a second set of inputs, respectively responsive to the outputs of the first adder and a validation signal, either for encoding or for decoding a message. The outputs of the gates of the second group are respectively connected to command inputs of the matrices to control multiplication of data with the coefficients of the polynomial generator. The logic circuitry comprises a third group of AND gates, equal to the number of data bits in each word. Each gate of the third group has first and second sets of inputs respectively responsive to the outputs of the last register of the last assembly and a feedback validation signal for selecting encoding or decoding of a message. The logic circuitry includes a tri-state gate, having inputs respectively responsive to the outputs of the last register of the last assembly. The tri-state gate has an output on which is derived either the symbols of a checkword to be appended to a message for coding said message, or the symbols resulting from a possible error configuration syndrome during message decoding. The tri-state gate has a command input designed to receive a validation, i.e., enable, signal.

According to a further characteristic of the invention, the system comprises plural detection circuits, each having inputs respectively responsive to the outputs of each first register of each assembly, for detecting the presence of a possible error syndrome in a decoded message. This syndrome is formed of the overall group of syndromes of each sub-block.

According to a further characteristic of the invention, the system additionally comprises circuits for decoding the possible error syndrome, which decoding circuits are connected to the error syndrome detecting circuits. The error syndrome is decoded sub-block by sub-block, and comprises the overall group of syndromes in the various sub-blocks.

According to a further characteristic of the invention, the circuits for decoding the error syndrome comprise a table for storing the error configuration. The table is connected to respond to the circuits for detecting the error syndrome. Indicators responsive to outputs of the table indicate the presence of errors in the entire data block. Among the indicated errors are the existence of single or multiple errors in each of the sub-blocks. These indicators respond to a counter driven by the clock pulses, to detect the position of each error containing word of the message, and to extract, one by one, from the last register of the last assembly, the words which respectively represent the error contents of the error containing words of the message. The indicator comprises a logic network for storing in memory the single or grouped double errors in each of the sub-blocks.

According to a further characteristic of the invention, the position of each error containing word of the message and the error configurations of these words define an error table stored in a memory.

According to a further feature of the invention, the system additionally comprises a buffer memory in which each data block of a message to be decoded is stored, wherein the useful symbols of the message are accompanied by symbols forming a checkword. When no error is detected during decoding, the useful symbols are directly transmitted to a user; however, when errors are detected during decoding, the error table allows those message symbols having errors to be corrected by masking symbols in the buffer memory, prior to transmission to a user.

According to a further feature, the circuits for detecting a possible error syndrome comprise, for each first register of each assembly having outputs for driving an "EXCLUSIVE OR" gate, an output coupled to one input of the error configuration recording table.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWINGS

FIGS. 1 and 2 are schematic drawings of first and second embodiments of a system for coding, detecting and correcting errors in a binary message according to the invention;

FIG. 7 is a table containing an interpretation of the error configuration, as a function of the number of decoded errors.

BEST MODE FOR CARRYING OUT THE INVENTION

Figure 1:
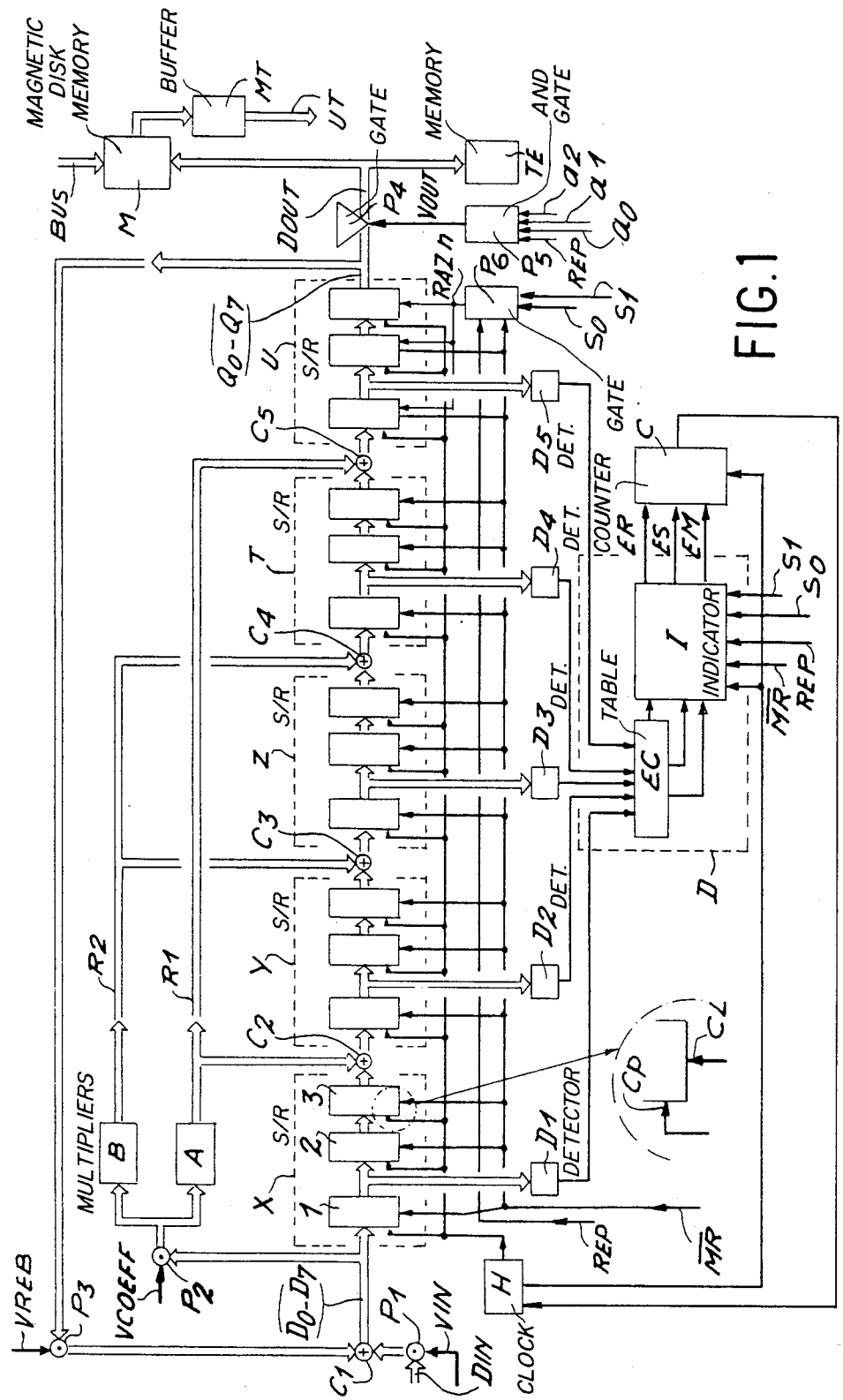

Before describing the structure and operation of the apparatus according to the invention, it is appropriate to review the Reed-Solomon code. The Reed-Solomon code operates on blocks organized in n symbols of m bits, such as $n = 2^m - 1$.

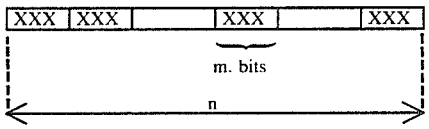

where n is the natural code length or period.

This code responds to theorems relating to linear codes and to Reed-Solomon codes. The theorems are:

If C is a linear code defined by the following parameters:

n = total length of the block (useful bits + key);
k = length of the useful data block;
r = length of checkword ($r = n - k$);
d = minimum distance of code,
then $n - k = d - 1$, or $r = d - 1$.

In a Reed-Solomon code:
$d = n - k + 1$, or $d = r + 1$; in this case, the length of the checkword is a minimum. The polynomial which generates a Reed-Solomon code is in the following form:

$$G(x) = \prod_{i=1}^{i=d-1} (x - \alpha^i)$$

More generally, interleaved Reed-Solomon codes are in the following form:

$$G(x) = \prod_{i=0}^{i=d-2} (x - \alpha^{l+i})$$

where l is a positive, negative or zero integer.

The roots of $G(x)$, are $$\alpha^l, \alpha^{l+1}, \alpha^{l+2}, \alpha^{l+3}, \alpha^{l+4}$$

if the logic distance d of the code is equal to 6.

If the roots of $G(x)$ are expanded, the result is:

$$G(x) = (x - \alpha^l)(x - \alpha^{l+1})(x - \alpha^{l+2})(x - \alpha^{l+3})(x - \alpha^{l+4}).$$

If $l = -2$ is selected, the result is $G(x) = (x - \alpha^{-2})(x - \alpha^{-1})(x - 1)(x - \alpha)(x - \alpha^2)$. The expansion of G(x) is then the following:

$$G(x) = x^5 + Ax^4 + Bx^3 + Bx^2 + Ax + 1$$

with $A = \alpha^{-2} + \alpha^{-1} + 1 + \alpha + \alpha^2$ and $B = \alpha^2 + \alpha^3 + \alpha^{-3} + \alpha^{-2}$ where $\alpha$ is the primitive element of a predetermined Galois field.

The method of obtaining the A and B coefficients in the system according to the invention is described below.

In the embodiment of the system according to the invention, described in detail below, the length k of the block of useful data is assumed to be 250 bytes, the total length n of the block (useful data + key) is 255 bytes and the logic distance is d = 6. Bearing in mind the theorems set forth above, the checkword (r) is equal to d − 1 and thus represents 5 bytes. The base code can be symbolically expressed in the form of C (255, 250, 6) and the polynomial which generates this case of the code is the form of:

$$G(x) = x^5 + Ax^4 + Bx^3 + Bx^2 + Ax + 1$$

$$G(x) = x^5 + A(x^4 + x) + B(x^3 + x^2) + 1$$

In the invention, the code is interleaved. Interleaving is a decomposition of a data block into a certain number of elementary sub-blocks, each having a length which does not exceed the length of the code word of the selected base code. An interleaving by three is represented below.

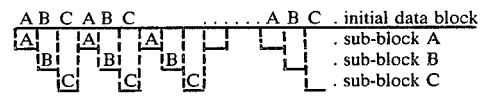

The "interleaving depth" (P) is the number of elementary sub-blocks deduced from an initial data block. For a base code of a given length, interleaving provides protection for longer data blocks.

In the base code selected in the example above, where the length n = 255 bytes with an interlacing depth of p = 3, it is possible to artifically lengthen the code base period to 255 × 3 = 765 bytes. Of these 765 bytes, 750 bytes relate to useful data and 3 × 5 = 15 bytes form the checkword. The 750 bytes of useful data resulting from the interleaving amply provide protection for a 512 byte block. This interleaved code additionally enables parallel operations to be performed on data organized in symbols of 8 bits.

Another important choice in the system according to the invention is selection of the logic distance $d = r + 1$. In the example under consideration where checkword r = 5, d = 6, simple reasoning shows that a code with a minimum logic distance d can provide correction for c errors and detect $\alpha$ errors, where c and $\alpha$ are part of the relationship:

$$c \leq \left\lfloor \frac{d-1}{1} \right\rfloor \text{ and } c + \alpha = d - 1,$$

where ⌊⌋ designates the whole element which is immediately below the value contained in this symbol.

When $d=6$, $c\leq 2$ and $c+\alpha=5$. There are several solutions ($S_1$, $S_2$, $S_3$) for the detection and correction capacity of the base code C(255, 250, 6) selected in the previous example. These solutions are expressed in the table below, for a checkword of 15 bytes.

| Solutions | number of correctable errors | number of detected errors |
|---|---|---|
| $S_1$ | 0 | 5 |
| $S_2$ | 1 | 4 |
| $S_3$ | 2 | 3 |

Interleaving the code produces two fundamental results, summarized below for the code selected:

(a) It increases the period of the code which increases from 255 to 765, as shown above. This means that a block of 512 bytes can be "covered".

(b) The code capacity for detection and correction can be increased locally. An error which affects three consecutive bytes, and which could not be corrected by the base code, will affect in this instance only one byte in each of the three code words.

Thus, certain burst errors which could attain a length of 24 bits, are treated by the code as single errors:

| X..X.XX. | XXXX.XX. | X....XXX |

Similarly, as illustrated in the two diagrams below, it is certain that any burst error of 17 bits or less is treated as a single error:

| ........X | XXXXXXXX | XXXXXXXX | ........ |
3 bytes

| ........ | XXXXXXXX | XXXXXXXX | X........ |
3 bytes

Obviously, these types of conditions can be produced twice inside the block since the base code can correct double errors. But it is also apparent that there is correction for any error condition over less than six consecutive bytes, i.e., error conditions of 48 bits, such as:

| X....X.X. | .X..X. | XXXX.XX. | .X...X.. | XXX...XX | X.XXXXXX |
6 bytes. (that is, 48 bits)

Similary, for any error condition over 41 or fewer consecutive bits, such as:

| XXXXXXXX | XXXXXXXX | XXXXXXXX | XXXXXXXX | XXXXXXXX | X....... |
41 bits

| ........X | XXXXXXXX | XXXXXXXX | XXXXXXXX | XXXXXXXX | XXXXXXXX |
41 bits can be corrected since each of the three interlaced code words are in the presence of an error affecting only two bytes. The number of error conditions which can be effectively corrected using an interlaced code is too high to define an overall classification.

FIG. 1 is a schematic drawing of a system for coding, detecting and correcting errors in a binary message; the system uses a cyclic code of the interleaved Reed-Solomon type. As indicated above, this message is composed of at least one block of symbols, each containing the same number of data bits. To simplify the description, assume that (1) each symbol is a byte, (2) the base code is C (255, 250, 6), (3) the interleaving depth is $p=3$, (4) the logic distance is $d=6$, (5) the polynomial which generates this cyclic code is a symmetrical polynomial represented by:

$$G(x)=x^5+Ax^4+Bx^3+Bx^2+Ax+1.$$

The polynominal is merely examplary for the embodiment under consideration.

The system comprises a shift register formed of a multiplicity of cascaded shift register assemblies (X, Y, Z, T, U), each having a parallel input and output. The registers in assemblies X, Y, Z, T and U are cascaded to each other and are connected to be simultaneously responsive to clock source H which applies clock pulses to shift inputs (CP) thereof, as indicated by the circled detail. The number (5) of register assemblies X, Y, Z, T and U is equal to the degree (5) of the polynomial which generates the cyclic code of the message to be processed. Each of assemblies X, Y, Z, T and U includes a number of series registers equal to the interleaving depth ($p=3$) of the cyclic Reed-Solomon code selected. Each register stores a number of bits equal to the number of bits in a symbol. In this embodiment, each register has eight input and eight output terminals (not shown in detail) since the symbols selected are bytes, one for each bit of a process symbol.

During initialization, all of the registers are reset to zero by an $\overline{MR}$ signal applied to the CL (clear) zero-reset input of each register. After initialization, the system responds to the symbols of a message to be encoded, then adds a control checkword formed of symbols obtained by concatenation to the useful symbols of the message. The parallel inputs of the first register (i.e. register 1 of assembly X) is also responsive to the symbols of a coded message containing a checkword and which may have errors that must be detected and corrected.

In a particular embodiment of the invention, wherein it is desired to write a message onto a magnetic disc of a magnetic peripheral (M), the system of FIG. 1 enables a user to add symbols forming a checkword to this message. The useful symbols are supplied directly to the magnetic peripheral (M) by bus BUS.

In the embodiment under consideration, having a code with an interleaving depth (P) of 3, the checkword contains 15 words, each formed of one byte containing bits $Q_0, Q_1 \ldots Q_7$. Bits $D_0, D_1 \ldots D_7$ of each byte of a message are received on input bus DIN of the system. These symbols are typically the symbols of a message to which a checkword is to be appended prior to being stored on a magnetic disc; for example, a message which is to be decoded to find the symbols which may contain errors, some of which may be corrected.

The system comprises a first EXCLUSIVE OR adder bank $C_1$, having parallel outputs which are respectively supplied to the parallel inputs of the first register 1 of the first register assembly X. Since the words to be processed are bytes, the first adder $C_1$ has eight output bits. Adder bank $C_1$ includes eight parallel inputs which are respectively connected to the eight parallel outputs of the last register n of the last register assembly U to perform modulo two additions of the bits in data symbol DIN and output bits $Q_0$–$Q_7$. Eight other inputs of adder bank $C_1$ respond to the data bits $D_0, D_1 \ldots D_7$ of each symbol of a message to be encoded or decoded. The system also comprises other intermediate EXCLUSIVE OR adder banks $C_2, C_3, C_4, C_5$, each of which performs modulo two addition of the bits of the pair of input symbols applied thereto. Each of intermediate adder banks $C_1$–$C_5$ includes eight inputs and outputs respectively coupled to the outputs and inputs of successive assemblies X, Y, Z, T, U of the shift registers. Eight other inputs of these intermediate adder banks are respectively connected by circuits $R_1, R_2$ to be responsive to the same inputs as the first register 1 of the first assembly X. Since last stage n of assembly U is coupled to the input of register 1, a feedback circuit is established from the $Q_0$–$Q_7$ output bits of stage n through circuits $R_1$ and $R_2$ to banks $C_2$–$C_5$.

Circuits $R_1$ and $R_2$ respectively include matrices A and B described in detail below. Each of matrices A and B multiplies the data of each received message symbol supplied to the system and the $Q_0$–$Q_7$ output bits by the coefficients A and B of the polynomial G(x) of the cyclic, interlaced Reed-Solomon code described above. These coefficients are obtained based on the primitive element of a predetermined Galois field. In the embodiment under consideration, matrices A and B are square matrices, each having eight inputs and eight outputs. Matrices A and B multiply the output binary outputs of adder bank $C_1$ by binary values representing the A and B coefficients of the polynomial G(x) so one of the inputs of the intermediate adder banks $C_2, C_3, C_4, C_5$ is respectively equal to the coefficients for $x^4, x^3, x^2, x$ and $x^0$, i.e., A, B, B, A, and 1.

The system additionally comprises logic circuits for selecting the system operating modes. These logic circuits include a first group of eight conventional AND gates $P_1$, one for each data bit of the message symbols received by the system. The AND gates $P_1$ of the first group are respectively responsive to the data bits $D_0, D_1 \ldots D_7$ of each word (byte) of a message to be coded or decoded. Each of gates $P_1$ of the first group responds in parallel to a common enable signal (VIN), to enable either coding of a data message or detection of errors in a message. The eight outputs of the gates $P_1$ of the first group are respectively connected to one set of inputs of the first EXCLUSIVE OR adder bank $C_1$.

The logic circuits for selecting the system operating mode also include a second group of AND gates $P_2$, one of which is provided for each of the eight data bits in each symbol of a message. The first set of eight inputs to the gates $P_2$ of the second group is respectively connected to respond to the outputs of the first adder $C_1$. Gates $P_2$ are driven in parallel to respond to enable signal VCOEFF. Enable signal VCOEFF occurs either during encoding or decoding of a message, to enable the multiplication operations to be performed by multiplication matrices A and B contained in feedback circuits $R_1, R_2$. The eight outputs of gates $P_2$ are connected to drive command inputs of matrices A and B in parallel.

The logic circuits additionally include a third group of eight AND gates $P_3$, one for each data bit in each symbol in a message to be coded or decoded. A first input of each of gates $P_3$ is respectively connected to be responsive to an output bit of the last register n of the last assembly U. Each of the gates of group $P_3$ is driven in parallel by a feedback enable signal VREB, for encoding or decoding a message.

Finally, the logic circuits for system operating mode selection comprise a conventional three state output gate $P_4$, having eight inputs respectively connected to respond to the $Q_0$–$Q_7$ output bits of the last register n of the last assembly U to derive an eight bit output DOUT. Output DOUT supplies either symbols of a checkword to be added to a message for encoding or supplies symbols resulting from a possible error syndrome during message decoding. Gate $P_4$ includes a command input responsive to an enabling signal EM when the symbol contained in register n of the last assembly U is to be read out as described in more detail below. Gate $P_4$ is controlled by logic circuit $P_5$ which derives enabling signal VOUT for gate $P_4$. Signal VOUT has a binary one value to command opening of gate $P_4$ in response to a the binary values of binary signals REP, $a_0, a_1, a_2$, supplied to circuit $P_5$.

Signal $\overline{MR}$ is a zero-reset signal, supplied directly to all of the registers of assemblies X, Y, Z, T and U, except register n, and to a specific zero-reset logic circuit $P_6$ for register n. Resetting register n is dependent on the interleaving depth.

The $a_0, a_1, a_2$ signals supplied to logic circuit $P_6$ select the operating modes of the device, as described below. The operating mode is selected to be one of the following: (1) computation of the syndrome or of the checkword (when the contents of all of the active register assemblies have not been dumped), (2) register dumping with zero reset, (3) register dumping with saving of register contents (when the contents of all the active register assemblies have been dumped), (4) error syndrome decoding, and (5) register shifting.

In response to the REP signal applied to the $P_5$ circuit having a high logic state, circuit $P_5$ derives output signal VOUT as a binary one value. The binary one value of signal VOUT indicates that the system is in the "decoding" mode and enables the DOUT outputs of circuit $P_4$ to be coupled to memory table TE. The trailing edge of signal $V_{OUT}$ resets the last active register of assembly U to zero through the $P_6$ zero-reset circuit. Circuit $P_6$ also receives the $\overline{MR}$ zero-reset signal that is applied to all of the register assemblies during initialization. Circuit $P_6$ also responds to binary signals $S_0$ and $S_1$ which define the interleaving depth P selected for the code under consideration. In the embodiment under consideration, this depth may have a value of 1, 2, 3 or 5.

In general, command signals such as CREB, VCOEFF, CIN, $\overline{MR}$, REP, $S_0, S_1, a_0, a_1, a_2$ are supplied, for example, by a processor (not shown) which supplies or receives data, or by a sequencer controlled by this processor.

The system also comprises detection circuits $D_1$, $D_2$, $D_3$, $D_4$, $D_5$, each having eight inputs respectively connected to respond to the eight output bits of the first register of each of register assemblies X, Y, Z, T, U. Detection circuits $D_1$–$D_5$, as described in detail below, detect the presence of a possible error syndrome in a decoded message. Each of circuits $D_1$–$D_5$ includes an OR gate having eight inputs so a binary one is derived from it in response to any of the bits in the first register of the register assembly associated with it having a binary one value.

Circuits $D_1$, $D_2$, $D_3$, $D_4$, $D_5$ have outputs respectively connected to drive inputs of decoding circuit D which detects for a possible error syndrome. Decoding circuit D comprises a table EC for storing the error configurations. Table EC includes five inputs respectively connected to respond to the outputs of the detection circuits $D_1$, $D_2$, $D_3$, $D_4$ and $D_5$. Decoding circuit D also comprises indicator I, connected to respond to outputs of table EC to indicate, through an ER signal, the presence of an error in a decoded message. Indicator I also derives output signals ES and EM respectively indicative of the presence of single or multiple errors among the errors detected in the message. Indicator I has outputs coupled to load inputs of counter C, having a clock input responsive to the H clock pulses.

Indicator I includes serial and sequential logic. For the assumed interleaving depth of three, indicator I indicates the presence of a grouped single or double error in each data sub-block. The presence of an error in the entire block is indicated by the ER signal, the errors are decoded sub-block by sub-block. A grouped single-bit error is indicated by indicator I deriving signal ES; a grouped double-bit error is indicated by indicator I deriving signal EM. Binary signals $S_0$, $S_1$ applied to the inputs of indicator I define the interlacing depth selected.

As described in greater detail below, counter C identifies the position of each error containing symbol of a message. Counter C supplies an enabling signal to clock H to control the shifts of register assemblies X, Y, Z, T and U so as to serially extract, from the last register n of the last assembly (U) symbols respectively representing the error configurations in those symbols of the message that contain errors. The position of each error containing word of the message and the error configurations in those words define an error table stored in memory TE.

The system also comprises a buffer memory MT in which is stored each data block of a message to be decoded originating from a data source, e.g. magnetic disc M. In buffer memory MT, the useful message symbols are separated from the checkwords. When no error is detected during decoding, the useful symbols are directly transmitted to the user through output bus UT of buffer MT. If an error is detected during decoding, error table TE corrects those symbols in the buffer memory (MT) having errors. Consequently, the message transmitted to the user no longer contains any errors.

The system of FIG. 2, a schematic drawing of another embodiment of the system according to the invention, operates in a similar manner to the FIG. 1 embodiment. However, in the embodiment illustrated in FIG. 2, the system selects, from among two cyclic Reed-Solomon message codes. The selection is achieved by adding multiplexers MX1 and MX2 and signal multiplication matrix E in which are stored one of the coefficients of another polynomial for the cyclic code of the message. Multiplexer MX1 is selectively responsive to (a) the eight parallel output bits of matrix A which provides some of the coefficients of the polynomial of a first code (defined above), and (b) the eight parallel output bits of matrix E which provides the coefficients of the other selected polynomial. Multiplexer MX2 is selectively responsive to the eight parallel output bits of the last register of the second assembly Y and to the eight parallel output bits of the last register of the next to last assembly T. The selected eight parallel output bits of multiplexers MX1 and MX2 are respectively supplied to two separate eight parallel bit inputs of adder $C_5$; in the first embodiment, the two inputs to adder $C_5$ are responsive to the outputs of assembly T and matrix A.

Multiplexers MX1 and MX2 respond to a control signal SC which provides for code selection. Signal SC is also applied to error configuration recording table EC to differentiate the various error configurations which may result from each of the codes. Therefore, with multiplexers MX1 and MX2 the base code (255, 250, 6), described above, can be selected by using matrices A and B in combination with circuits $R_1$ and $R_2$; alternatively a second code which uses only matrix E, in combination with circuit $R_1$, can be selected.

The base code of the second code is: C' (255, 252, 4). The second code has a minimum code distance of d=4, $C_0=1$ correctable errors and $\alpha=2$ detected errors. The second code is a degenerated code, having a polynomial G'(x) in the form:

$$G'(x)=(x-\alpha^{-1})(x-1)(x-\alpha)$$

where $\alpha$ is a primitive element of a Galois field $GF(2^8)$; the polynomial G'(x) can be expressed as a symmetrical polynomial:

$$G'(x)=x^3+E(x^2+x)+1$$

In matrix E eight data bits $D_0$–$D_7$ are multiplied by the coefficient E, the coefficients of $x^2$ and x in polynomial G'(x). Polynomial G'(x) provides a redundancy of 3 bytes; the code obtained using matrices A and B for polynomial G(x) has a redundancy of 5 (5 bytes).

In the examples of FIG. 2 command SC controls multiplexers MX1 and MX2 to inhibit the third and fourth assemblies Z and T of registers which are set to zero. Apart from this selection characteristic, the system operates in the same manner as the embodiment shown in FIG. 1.

As indicated above, it is possible by using signals $S_0$ and $S_1$ to select from four different interleaving depths (1, 2, 3, 5) and to use signal SC for selecting one of two different codes. There are therefore eight possible combinations for selecting a polynomial.

Figures 3A, 3B, 6:
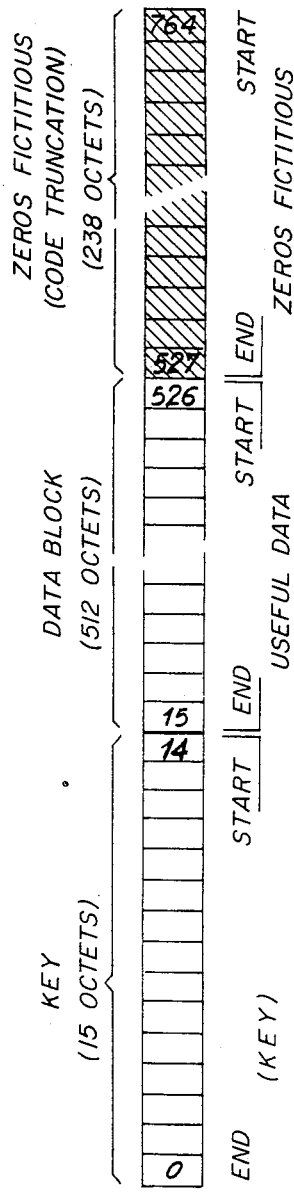
FIGS. 3a and 3b are schematic representations of multiplication matrices included in feedback circuits of the system according to the invention.
FIG. 6 is a schematic representation of the numbering of bytes in a block, for interleaving by three.

FIGS. 3a and 3b are schematic representations of multiplication matrices A and B from which are obtained the coefficients of the generator polynomial of the selected cyclic Reed-Solomon code.

Multiplication matrices A and B are cable matrices which, for a message wherein the symbols are bytes, contain eight columns in eight rows. At each intersection a binary bit is multiplied by a binary zero or one value, depending on the coefficient value. For a binary zero coefficient at a particular intersection, no connection exists at the intersection; for a binary one coefficient a connection exists at the intersection between the row and column through an isolating impedance, such as a diode. Each row is responsive to a different one of bits $D_0$–$D_7$. The products of the binary multiplications in column k, where k is every one of 0–7, are applied to inputs of an EXCLUSIVE OR output gate of column k, except those columns having only one binary one coefficient. In the latter case, the column has an output terminal responsive to the single multiplication operation of the column to derive an output that is the same as the product of the binary multiplication in the column; this result is achieved by omitting the column output gate and providing a connection, generally through a buffer amplifier, between the column and the output terminal thereof. Each of matrices A and B includes eight parallel output bits, each derived from a separate EXCLUSIVE OR output gate, except as above noted. Each of the output gates supplies a signal to an output terminal indicative of the modulo two addition of the inputs thereof. The outputs of matrices A and B are respectively denoted $A_0, A_1 \ldots A_7$ and $B_0, B_1 \ldots B_7$.

According to the invention, an important characteristic of matrices A and B is that the coefficients which they contain are obtained by using a systematic search through the 16 Galois fields containing $2^8=256$ elements, based on the coefficients $A=\alpha^{-2}+\alpha^{-1}+1+\alpha+\alpha^2$ and $B=\alpha^{-2}+\alpha^{-3}+\alpha^2+\alpha^3$ of the selected polynomial. Each of matrices A and B optimizes the number of inputs of each of the EXCLUSIVE OR output gates. The Galois field is obtained by using a primitive, irreducible polynomial selected from among the 16 possible primitive polynomials, shown in the Peterson table described in the work entitled "Error Correcting Code", MIP Press, 1972. The Peterson table enables derivation of a polynomial G(x) which generates a cyclic, symmetric code having two coefficients, A and B. The logic equations for signals $A_0$–$A_7$ and $B_0$–$B_7$ derived by gates $A_0$–$A_7$ and $B_0$–$B_7$ are:

$A_0 = D_7, A_1 = D_2 \oplus D_3$.

$A_2 = D_2 \oplus D_4 D_7, A_3 = D_0 \oplus D_2 \oplus D_3 \oplus D_5 \oplus D_7$.

$A_4 = D_1 \oplus D_3 \oplus D_4 \oplus D_6, A_5 = D_4 \oplus D_3$.

$A_6 = D_0 \oplus D_5 \oplus D_6, A_7 = D_1 \oplus D_6 \oplus D_7$.

$B_0 = D_6, B_1 = D_7, B_2 = D_0 \oplus D_6, B_3 = D_1 \oplus D_6 \oplus D_7$.

$B_4 = D_2 \oplus D_7, B_5 = D_3 \oplus D_6$, $B_6 = D_4 \oplus D_7, B_7 = D_5$.

The signals at outputs $A_0$–$A_7$ and $B_0$–$B_7$ are coupled to inputs of EXCLUSIVE OR adder gates $C_2$–$C_5$, as described supra. Input data bit $D_7$ is directly coupled to inputs of adders $C_2$ and $C_5$, as signal $A_0$, by a direct connection, thus bypassing gate $A_0$. In matrix B, gates $B_0$, $B_1$ and $B_7$ are bypassed, since input data bits $D_6$, $D_7$ and $D_5$ are directly transmitted as signals $D_6$, $D_7$ and $D_5$, respectively, to the inputs of adders $C_3$ and $C_4$. Matrix E, which is employed in the second embodiment of the system, is not shown in detail. The connections of matrix E are based on the same considerations as those for matrices A and B.

The following description provides a better comprehension of the operation of the system according to the invention. The various operating modes are provided in the table below wherein the legends YES and NO respectively indicate whether the enabling signals VIN, VCOEFF, VOUT, VREB, respectively applied to gates $P_1$, $P_2$, $P_3$, $P_5$, have binary one and zero values.

TABLE

| System Operating Mode | VIN Enabling Signal ($P_1$ gates) | VCOEFF Enabling Signal ($P_2$ gates) | VOUT Enabling Signal ($P_5$ gates) | VREB Enabling Signal ($P_3$ gates) |
|---|---|---|---|---|
| COMPUTE (key or syndrome) | YES | YES | NO | YES |
| DUMP KEY AND RESET REGISTERS TO ZERO | NO | either YES or NO | YES | NO |
| DECODE (syndrome) | NO | YES | NO | YES |
| LOAD (registers) | YES | NO | NO | either YES or NO |
| DUMP KEY AND RETURN TO REGISTER CONTENTS | NO | NO | YES | YES |

In the "compute" mode, the system computes the checkword or the error syndrome. The data bits DIN to be written into (in computing the checkword) a disc or to be read (in computing the syndrome) from a disc, for example, are sequentially fed to register 1 of register section and to matrices A and B (or matrices A, B and E) in response to gates $P_1$ and $P_2$ being enabled by binary one values for signals VIN and VCOEFF. Simultaneously, gate $P_3$ is enabled in response to the binary one value of signal VREB to feedback bits $Q_0$–$Q_7$ from register n to gate $C_1$. At the same time gate $P_4$ is closed in response to network $P_5$ responding to signals $A_0$, $A_1$, $A_2$ and REP, so signal VOUT is a binary zero and no output data bits DOUT are derived.

In the "dump" mode, with the registers of assemblies X, Y, Z, T and U reset to zero, the system concatenates the checkword to the useful data block and extracts an error configuration or syndrome for processing. The intermediate feedforward circuits including matrices A and B are decoupled from the system so that the 15 8-bit parallel registers of assemblies X, Y, Z, T and U form a single fifteen-state serial/parallel register. In response to signal VIN=NO, gates $P_1$ decouple signal DIN from gates $C_1$. In response to signal VOUT=YES, gate $P_4$ is enabled so bits $Q_0$–$Q_7$ are coupled to output DOUT. In response to fifteen clock pulses from source H, the contents of the registers in assemblies X, Y, Z, T and U are transferred through gate $P_4$ either onto disc M, for instance, after computing the checkword, or to a microprocessor (not shown) in certain syndrome analysis cases. The registers of assemblies X, Y, Z, T and U are then reset to zero in response to binary one values of REP and MR signals, as occurs after the 15 clock pulses.

In the "decoding" mode, there is a search for know configurations of specific single or double errors during 765 successive shifts of the registers of assemblies X, Y, Z, T and U, as commanded by clock H. The interval required for 765 shifts corresponds to the period of the interleaved code; depth 3 in the example. The feedback circuit for bits $Q_0$–$Q_7$ to gates $C_1$ and to matrices A and B are maintained in response to signals VREB and VCOEFF both having binary one values, as in the "compute" mode. However, the DIN input bits are decoupled from gates $C_1$ in response to VIN signal=0, while the $Q_0$–$Q_7$ bits are coupled through gate $P_4$ as the DOUT output bits in response to VOUT signal=NO. The contents of the registers of assemblies X, Y, Z, T and U are shifted in response to each clock pulse from source H and are subsequently changed by the feedback circuit through gates $P_3$ and $C_1$. The general principle is that, at the end of a certain number of clock pulses, the error configuration appears in the registers. This error configuration is detected with the aid of detectors $D_1$-$D_5$, network EC and indicator I which derives signals ES and EM described in greater detail below.

In the "load" mode, there are performed certain operations, such as loading a given configuration into the registers for decoding. The feedback circuits $R_1$ and $R_2$ are eliminated and assemblies X, Y, Z, T and U function as a normal shift register, as in the dump mode, in response to signal VCOFF having a binary zero value and signal VREB being either a one or zero. In this instance, the DIN input bits are coupled to the registers of assemblies X, Y, Z, T, and U in response to signal VIN being a binary one while the DOUT output bits are disabled in response to signal VOUT being a binary zero. The load mode either initializes the registers having binary bit contents other than all zeros (normally performed in response to signal $\overline{MR}$ having a one value) or introduces specific configurations resulting from intermediate computations originating from a microprocessor (not shown).

In the "dump checkword and return to register contents" mode, the feedback circuit including circuits $R_1$ and $R_2$ and gates $P_3$ is enabled in response to binary one values for signals VREV and VCOEFF. Input bits DIN are not coupled to the registers of assembly X because signal VIN has a binary zero value.

Computation of a checkword to be added to a message is based on the useful data in a block of k bytes. This checkword is concatenated to the useful block to form a code word of $k+r=n$ bytes.

The computation involves:

(a) initializing the system by applying an $\overline{MR}$ signal to the CL zero-reset inputs of the registers of assemblies X, Y, Z, T, U;

(b) setting the circuit to the "compute" mode in response to signals VIN and VCOEFF having binary one values;

(c) supplying k pulses from clock H to the registers while k useful bytes or symbols are being supplied to an output device, disc M for example;

(d) activating the dump mode immediately following the kth clock pulse; and (e) supplying r additional clock pulses from clock H to register assemblies X, Y, Z, T, U to read the contents of the assemblies to the output device, disc M, for example.

In the case of an interleaving depth of three, the maximum value of k is 750. However, by truncating the code, value of k can be reduced to 512 bytes, for example. For the same interleaving depth of 3, the key length is r=15 bytes.

Since initialization (step a) involves resetting all of the system registers to zero, it is as if starting from an initial all zero state, 238 bytes, all having binary zero bits, have been supplied to the register including assemblies X, Y, Z, T and U. The registers remain loaded with binary zeros since the feedback line is permanently at zero. The 238 zero bytes are followed by the 512 useful bytes. This reasoning enables the very simple truncation mechanism to be used in the read phase. Here, the only imperative is that the length (useful data +checkword) of the actual code word be less than or equal to the code period. The k bytes or checkword of useful data and the r bytes of the checkword form a code word which, during the read phase, is read all at once, with no break in the clock pulse sequence when the boundary between useful data and key has been surpassed.

Reading a messsage and detecting the errors therein involve generating the error syndrome based on data read from a disc, for example, and of testing this syndrome. If the error syndrome is zero, it can be assumed that no errors exist, and the information which is temporarily stored in the buffer memory (MT) can be enabled for use. If the error syndrome is not zero, an error condition exists. An attempt is made to correct this error condition by the procedure indicated below.

Message reading and error detection involve:

(a) initializing the system by deriving the $\overline{MR}$ command signal as a binary one:

(b) placing the system in the "compute" mode by sequentially deriving signals VIN and VOUT as binary one values;

(c) serially injecting into the registers the exact number of bytes forming the entire block (i.e., useful data and the checkword for all of the interleaved code words);

(d) sampling the ER error indicating signal at the output of the indicator I; signal ER is a binary signal respectively having values of zero and one for no and at least one error. While the data are injected into the registers, they are also loaded into the buffer memory MT.

In response to sampled error signal ER derived during operation (d) having a value of one to indicate the presence of at least one error, the following operations are performed:

(a) syndrome decoding, i.e., identification of the elements causing an error condition in the form of a group of error bytes (each group of error bytes is characterized by a position in the block and by the contents thereof);

(b) a decision to correct;

(c) performing the effective correction, that is, correction masking in the buffer memory TE.

The syndrome decoding operation is linear and reversible. Within the power span of the code, the decoding operation directly replaces this syndrome with useful information on each of the errors (error position and content). All information exists in the syndrome but it is cryptic and is not directly recognizable to provide for error correction, or to enable a decision to be made as to whether the errors can be corrected.

The extent of an error (E) is indicated by the logic difference between the original data (D) (assumed to be free of errors) and the data (D') which are read and contain errors. The logic operand to determine the error extent is the EXCLUSIVE OR ($\oplus$) function which operates bit by bit on the message overall. This leads to the relationship $E=D\oplus D'$ which is equivalent to $D=E\oplus D'$. The EXCLUSIVE OR operation can be performed for each error taken separately. It is performed only in those positions where an error exists. In the case of a Reed-Solomon code organized in bytes, the operation is thus performed byte by byte, and only for those bytes containing errors.

A "single error" is defined as an error which affects only one byte in a given code word or block. A "multiple error" is defined as an error which affects several bytes of the same block or code word, without specifying the relative position of these bytes in the code word. A "ground multiple error" is defined as an error such that the bytes which form it are framed in an area, having a length which is less than or equal to the length of the checkword.

In conventional systems, decoding the syndrome in the case of any type of multiple errors is a complex operation involving mathematical algorithms which would be difficult to define in this document. In addition, the time for performing these algorithms can be very substantial in the case of complex errors.

The system according to the invention provides for simple decoding of single and grouped multiple errors by sweeping and by one pass of the code period. During the sweeping operation clock H derives the desired number of clock pulses, as controlled by counter C. Counter C responds to clock H so that for each clock pulse the counter samples the values of signals ES and EM of indicator I to respectively determine the presence of single and grouped multiple errors. One of the remarkable properties of this apparatus is that it can be applied to an interleaved code without involving the interlacing rule. For this reason, and to clarify the description, the principle of a non-interleaved code is examined.

Figures 4A, 4B:
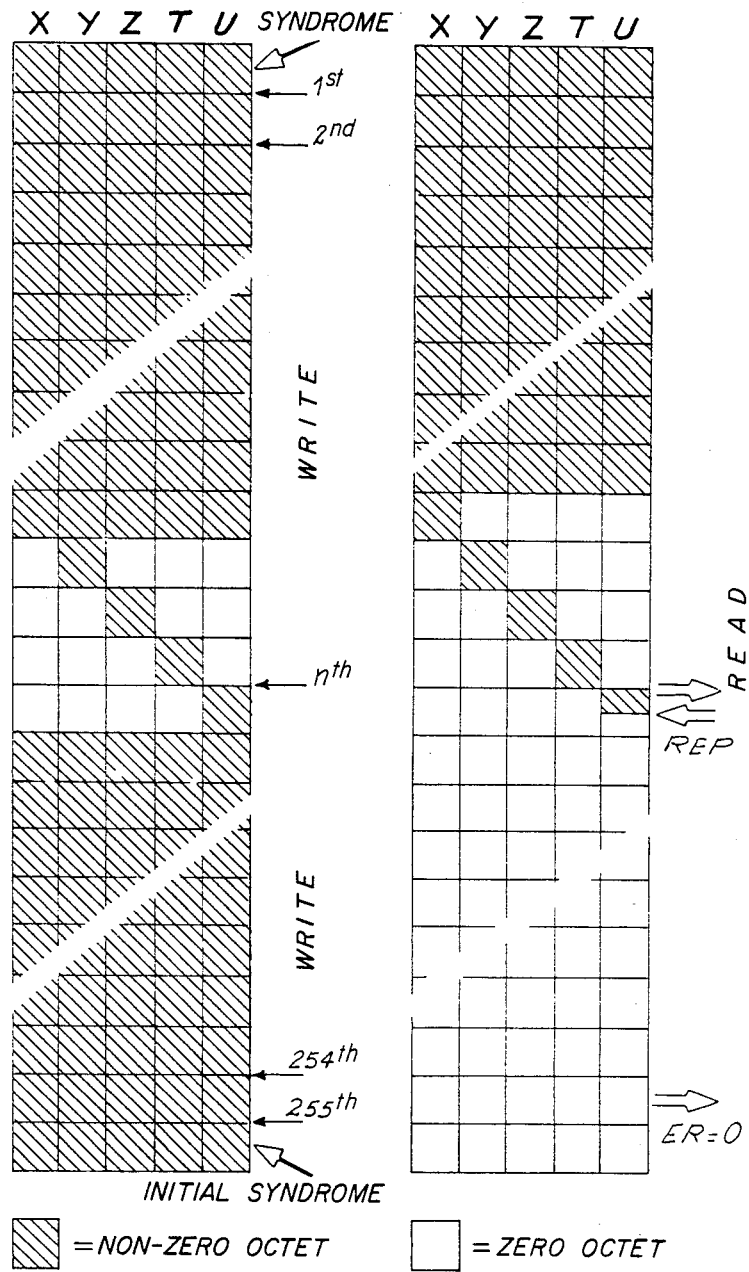
FIGS. 4a and 4b are schematic drawings of an error syndrome contained in the system registers during decoding of single errors contained in a message.

FIGS. 4a and 4b are respectively illustrations of loading and readout operations that occur in register assemblies X, Y, Z, T and U in the case of a single error. A sequential sweeping process of the contents of register assemblies X, Y, Z, T and U is shown, for an error syndrome in a 5-column, 256-line table. Each column respectively corresponds to the contents of each of the five shift register assemblies X, Y, Z, T and U. The rows respectively correspond to the successive states of the register after each shift caused by a pulse from clock H. Each box represents the contents of one register assembly at a given moment; that is, each box indicates if all of the bits of one byte are zeros (a blank box) or if a byte contains at least one bit having a one value (a box with hatched lines).

To assist in understanding the decoding mechanism, the following situations are considered with reference to FIGS. 4a and 4b:

(1) a byte containing all binary zero bits
(2) a byte containing at least one binary zero bit.

The first row of the table of FIG. 4a is a schematic representation of an error syndrome as the contents of the assembly shift registers X, Y, Z, T and U at the very end of a read or load operation, prior to the decoding process. In response to each clock pulse, the contents of the register assembly evolves by the simultaneous action of bytes being (1) shifted one register to the right, and (2) reinjected into the assembly by intermediate feedback circuits. These simultaneous actions cause the information to be shifted and to be modified in response to each clock pulse. As a general rule, there are five non-zero bytes in the assembly at any time although an isolated zero byte may occur from time to time. The non-zero bytes contain information about the errors, but are always in cryptic form.

In the case of a single error, assume that four zero bytes are loaded spontaneously into the registers of assemblies Y, Z, T and U. The non-zero value of register assembly X is assumed to be a byte E containing an error. Because all of the bits on the feedback line supplied by the last register n of assembly U are zeros during the next four shifts, error containing byte E is shifted from assembly X to assembly Y then sequentially to assemblies Z, T and U; during these shifts, the other bytes remain at zero. The last register n is reset to zero in response to signal RANn; a binary one value of signal RAZn is derived by AND gate $P_6$ when an error syndrome occurs in response to binary one values of signals $\overline{MR}$ and REP being supplied to the gate. In this case, counter C controls clock H so five clock pulses are derived to trap and extract the contents of error byte E.

The error is detected with detectors $D_1$–$D_5$ and network EC and indicator I. Each of detectors $D_1$–$D_5$ respectively derives binary zero and one levels in response to all eight of the bits supplied to it being zero and at least one bit supplied to it being a one. Network EC and indicator I respond to the outputs of detectors $D_1$–$D_5$ so that signal ES has a binary one value if four of detectors $D_1$–$D_5$ derive a binary zero and the remaining detector derives a binary one. A binary one value for signal ES indicates that a single error has been detected. Conventional logic circuits are used in detectors $D_1$–$D_5$ (e.g each of detectors $D_1$–$D_5$ is a NOR gate) network EC and indicator I to derive the result. After the 254th clock pulse (the 255th row of FIG. 4a), the code period has been completed once, and only once. A 255th clock pulse (indicated by the 256th row of FIG. 4a) restores the register assembly to the initial contents thereof, i.e., the syndrome.

Single errors are therefore decoded by trapping the error in register n of assembly U and by extracting the contents of register n and placing them in the error memory table TE. The clock pulses are counted by counter C and stored in memory table TE. The stored count indicates the position of the error in the code word. The contents of register n of assembly U are reset to zero immediately after the byte is extracted from it, and before the cock pulse following immediately after the clock pulse which resulted in the extraction of the error byte from it. Thus, register n is completely empty and remains that way (FIG. 4b).

Register n is reset to zero by a binary one value of RAXn, in turn derived from zero-reset logic circuit $P_6$ in response to binary one values for signals $\overline{MR}$ and REP. The last active register of the last assembly (U) is reset to zero. In the case of an interlacing depth of 3, there are two inactive registers in each assembly with zero bytes therein. Logic circuit $P_6$ responds to the binary values of signals $S_0$ and $S_1$, which define the interlacing depth, to control which one of the registers of assembly U is the last active register and is to receive the zero-reset command RAZn. In the assumed case $S_0$ and $S_1$ activate circuit $P_6$ to select the third register of assembly U as the last register. The advantage of selectively controlling the last register of assembly U is described below.

In many messages there is no single error and signal ES is not derived.

Figures 5A, 5B:
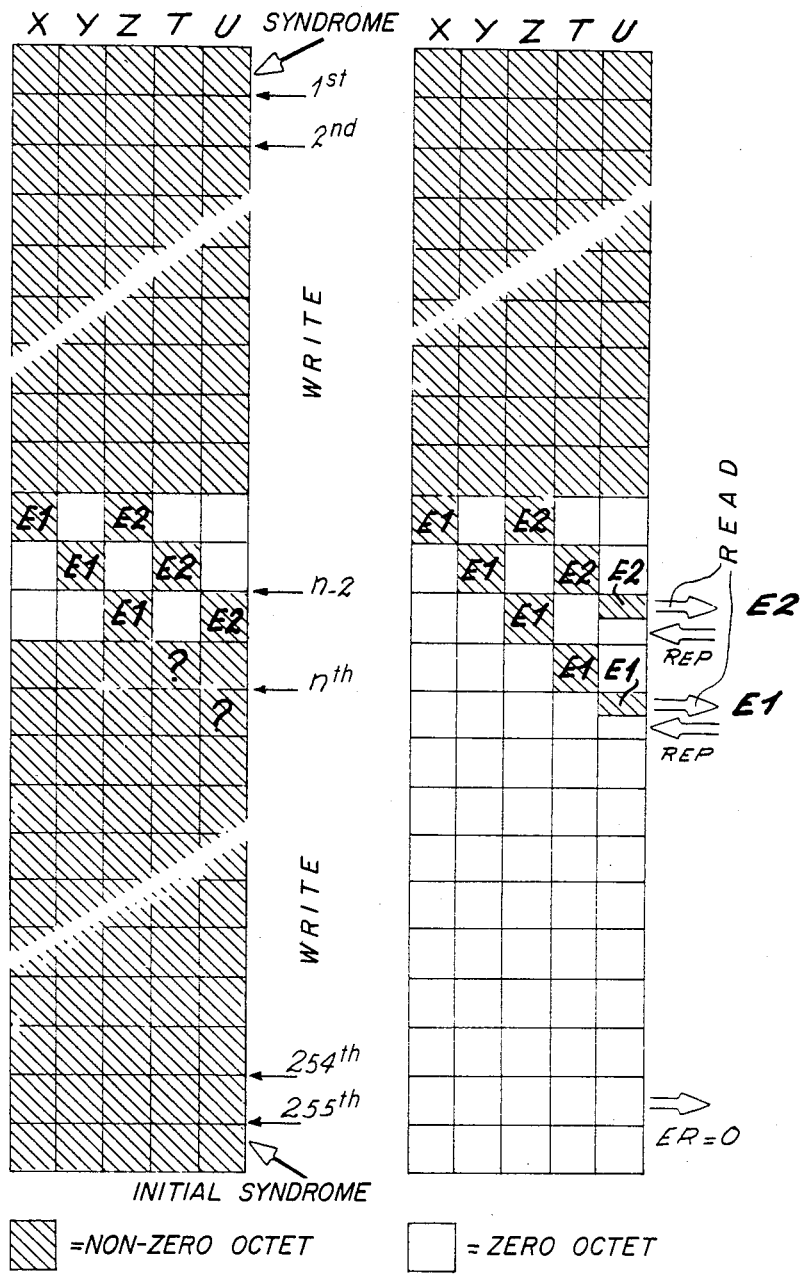
FIGS. 5a and 5b are schematic drawings of the error syndrome contained in the system registers during decoding of multiple errors in a message.

The loading and readout operations illustrated as examples in FIGS. 5a and 5b assist in describing what occurs in the case of a grouped double error. In the example of FIGS. 5a and 5b it is assumed that two erroneous bytes are separated by one valid byte. The sequential process initially operates as described above with reference to FIG. 4. That is, cryptic data evolves in register assemblies X, Y, Z, T and U at a given time during the search. Three zero bytes, i.e., bytes containing only zero bits, are spontaneously loaded into three of assemblies Y, Z, T and U. In the example, the zero bytes are loaded into assemblies Y, T and U. Non-zero bytes $E_1$ and $E_2$, i.e., bytes having at least one binary one bit, are loaded into register assemblies X and Z, respectively. The contents of bytes $E_1$ and $E_2$ respectively include the first and second errors.

Two additional pulses from clock H shift byte $E_2$ from assembly Z to assembly U and shift byte $E_1$ from assembly X to assembly Z. In this case, three successive pulses from clock H are needed to trap both of error bytes $E_1$ and $E_2$ (rather than five pulses as in the case of a single error). It is necessary to trap both of the errors after three clock pulses; it is not possible to trap with more than three clock pulses since the contents of the register are coded again during the fourth clock pulse.

The double error is indicated by indicator I deriving a binary one value for signal EM. In one embodiment indicator I includes a majority function (2 out of 5) logic circuit responsive to the binary signals derived by detectors $D_1$-$D_5$. Alternatively and preferably indicator I includes a compound majority function logic circuit responsive to the outputs of detectors $D_1$-$D_5$ in accordance with $u \cdot ([x,y,z,t] = 1)$ (where u, x, y, z, t are respectively the outputs of detectors $D_1$-$D_5$, i.e. indicate zero and non-zero values for the bytes of the first registers of assemblies U, X, Y, Z, T). Error byte $E_2$ is trapped in register assembly U. Error bytes $E_1$ and $E_2$ are extracted by shifting to the "dump" mode. Once error byte $E_2$ has been extracted from the last register n of assembly U as a result of gate $P_4$ being enabled by signal VOUT register n is reset to zero in response to the REP command being applied to logic circuit $P_6$. Extraction of byte $E_2$ from register n does not change the first error byte $E_1$ in stage Z. On the other hand, the four stages X, Y, T and U now have zero bytes stored therein. The same condition now exists as exists after the clock pulse of row $n-2$ in the process for decoding a single error. The progression cycle is then reactivated, until error byte $E_1$ is trapped in register n of assembly U. Indicator I includes logic circuit with the function $ES=NOT[(x)OR(y)OR(z)OR(t)]$ to detect error byte $E_1$ in register n. Alternatively and preferably, indicator I includes logic circuitry to derive an indication of a double error trap in accordance with the compound majority function:

$$EM = u \cdot [(x,y,z,t) \leq 1]$$

The compound majority function EM includes the ES function. The truth table for ES and EM is the following:

| X | Y | Z | T | U |
|---|---|---|---|---|
| ▨ |   |   |   | ▨ |
|   | ▨ |   |   | ▨ |
|   |   | ▨ |   | ▨ |
|   |   |   | ▨ | ▨ |
|   |   |   |   | ▨ |

ES ← { ... }  EM →

In other words, EM = 1 if U = 1 and any but only one of X, Y, Z or T = 1; or EM = 1 if U = 1 and none of X, Y, Z or T = 1, i.e. $EM = (X+Y+Z+T+\overline{XYZT})U$; ES = 1 if U = 1 and none of X, Y, Z or T = 1, i.e. $ES = \overline{XYZT}U$.

The logic circuits which derive signals ES, EM and ER in indicator (I) are not shown in detail because they are obvious to one of ordinary skill in the art from the above logic statements and equations.

Error byte $E_1$ alone could not have been extracted and expected to reach assembly U, if the zero-reset operation had not been performed after extracting error byte $E_2$. Indeed, with error byte $E_2$ reactivating the feedback line including gate $P_3$, error byte $E_1$ would have been disturbed, i.e., shifted, in response to the next clock pulse before byte $E_1$ could reach the last register of assembly U.

The apparatus displays the following advantages:

(1) applicable to any type of grouped multiple errors (within the span of the code selected);

(2) operates independent of the interleaving (not shown on FIGS. 4a, 4b and 5a, 5b);

(3) does not require the entire contents of the register assembly to be dumped, an operation which can become complex in the case of an interleaved code due to the need to sort information in the different code words; and (4) enables the contents of the register assembly to be tested to determine whether the assembly is empty, at any time, once the errors have been extracted.

More particularly, the overall error indicating ER signal can be sampled after the 254th clock pulse, to indicate if the overall register assembly for the various code words is empty, that is, that all of the errors have been decoded.

The definitions for signals ES and EM enable the user to select one of two options:

(a) a grouped double error option (EM signal), capable of detecting triple errors and to indicate the existence of a possible double error; and (b) a single error option (ES signal) which is less powerful but provides increased protection against the risk of miscorrection. (With this option, the system can still possibly indicate the existence of double, triple and quadruple errors).

The numbering of bytes in a message for an assumed interleaving of 3, is shown in FIG. 6. The message includes a data block of 512 bytes, a key of 15 bytes and 238 fictitious zero bytes. The bytes are derived sequentially in reverse order so that byte 764 is the first byte of the message and byte zero is the last message byte. The 238 fictitious zero bytes are numbered 764 to 527 and correspond to the fictitious zeroes due to shortening of the code. The decoding device of FIG. 1 or 2 should, normally, never be activated to process these bytes. If the decoding device does process these bytes this is irrefutable proof that a miscorrection is about to be made. The 512 useful bytes are numbered 526 to 15. By removing byte 15, natural reverse numbering of the bytes occurs, which is an advantage for addressing buffer memory MT. The 15 bytes which form the key are numbered 14 to 0 (byte 14, the first byte of the checkword, corresponds to the output of register assembly U in the syndrome, since the number of registers in assemblies X, Y, Z, T and U is equal to the 15 byte length of the key).

After the above detecting operations have been performed the error containing bytes are corrected by using the following principles:

(a) at the end of the decoding phase, a table of errors, assumed to have affected the 512 byte data block, is stored in memory TE; and (b) a decision as to whether the data block is to be corrected is then made.

Since multiple errors may exist, and although the logic distance of the code provides natural protection against the risk of miscorrection, some precautions should be taken.

The process described above is linear and reversible. That is, it is always possible to reconstitute the initial syndrome based on information contained in the table stored in memory TE. However, once the correction has been made in the buffer memory MT and once the contents of register assemblies X, Y, Z, U and T and the error table TE have been erased to process the information in a new block, it is too late to reverse the operation if a miscorrection has contaminated the block that has just been processed.

Therefore, every precaution must be taken at this time to avoid faulty correction. In addition, the addresses of the decoded errors must be sorted. If the address of the decoded error is inside the checkword, it is generally ignored. If the address is in the area of fictitious zeroes, a miscorrection case exists; but it can be avoided.

Since the system corrects multiple errors, the number of errors must be determined. Since the interleaving depth is 3, the error table can contain between 1 and 6 decoded errors, according to the table in FIG. 7. An examination of the modulo 3 congruences between the addresses of the various errors provides the exact configuration of the existing condition, and indicates whether this case is valid. After ths system has been decoded the errors and made a decision as to whether they can be corrected, the errors are stored in table TE and indicated by the number of bytes requiring correction and the rescpective position, i.e. number, in the block of each byte requiring correction. Additionally, raw data are stored in buffer memory MT.

The correction involves applying a correction mask which, for the selected Reed-Solomon code, consists of performing the logical Boolean operation: $D = D' \oplus E$ for each byte containing an error. This operation can be performed by a microprocessor (not shown). The fact that the natural address of the bytes in the block are present in the error table facilitates the correction operation.

While there have been described and illustrated several specific embodiments of the invention, it will be clear that variations in the details of the embodiments specifically illustrated and described may be made without departing from the true spirit and scope of the invention as defined in the appended claims.

We claim:

1. A system for coding, detecting or correcting transmission errors in an interleaved Reed-Solomon cyclically coded binary message, formed of at least one useful sub-block of symbols each having the same number Dn of data bits, the number of sub-blocks corresponding to an interleaving depth of the code, the code being represented by a polynominal $G(x) = Ax^n + Bx^{n-1} + \ldots Nx + 1$, said coding system comprising several cascaded connected shift register assemblies 1, 2 . . . n having parallel input and output bits, each assembly having a number of cascaded shift registers equal to the interleaving depth, k, of the code, whereby there are n·k of said registers arranged as registers 1, 2, . . . (n·k−1) and n·k, means for shifting the bits in register P to register P+1, where P is selectively each of registers 1, 2, . . . (n·k−1), means for initially sequentially loading into register 1 (1) data symbols of a message to be encoded as modified by a control checkword formed of symbols obtained by concatenation with the useful message symbols or (2) data symbols of a coded message containing a checkword and which may include errors, a first EXCLUSIVE OR adder having output bits respectively coupled to inputs of register 1, the first adder having a first set of inputs respectively responsive to outputs of register n·k and a second set of inputs responsive to the message data symbols, intermediate EXCLUSIVE OR adders, each having a first set of inputs and a set of outputs respectively responsive to the outputs of register j and supplying signals to inputs of register (j+1), where j is selectively every kth one of P, the intermediate adders including a second set of inputs respectively connected by circuit means to be responsive to the same bits as applied to the inputs of register 1, the circuit means respectively including matrix means for deriving the coefficients of the polynomial G(x) of the cyclic code of the message; said coefficients being obtained from primitive elements of a predetermined Galois group and being stored in the matrix means; the matrix means modifying the second inputs of the intermediate adders by binary values representing the coefficients of the polynomial G(x).

2. The system of claim 1 wherein the matrix means includes plural matrices for deriving the coefficients for different polynomials of the cyclic, interleaved Reed-Solomon code of the message, multiplexer means for selectively connecting different combinations of the matrices in the circuit means to different ones of the intermediate adders, and means responsive to a selection signal for controlling the matrix means to provide selective connections between outputs of the matrix means and the second inputs of the intermediate adders.

3. The system of claim 2 wherein the matrix means for deriving the coefficients of the polynomial G(x) includes inputs responsive to the data bits and outputs which are supplied by the circuit means to the first set of inputs of the intermediate adders, connections in the matrix means being such that certain output bits of the matrix means are replicas of an input bit thereof and other output bits of the matrix means are EXCLUSIVE OR functions of plural input bits of the matrix means, wherein the polynomial G(x) which generates the elements of the Galois group is selected from among 16 primitive polynomials and a primitive element of the Galois group is selected to minimize the number of EXCLUSIVE OR gates.

4. The system of claim 3 further including logic means for selecting different system operating modes, said logic means comprising first, second and third groups of AND gates, the number of gates in each of the first, second and third groups being equal to the number of data bits in each message symbol, each AND gate in the first group having first and second sets of inputs respectively responsive to the data bits in each symbol and a first enabling signal, the first enabling signal controlling encoding and decoding of a message, each AND gate of the first group having an output respectively coupled to an input of the first set of inputs of the first EXCLUSIVE OR adder; each gate of the second group having first and second sets of inputs, the first and second sets of inputs of the second group of gates being respectively responsive to the outputs of the first adder and a second enabling signal, the second enabling signal controlling encoding and decoding of a message, the outputs of the second gates being respectively coupled to inputs of the matrix means to be multiplied with the coefficients of the polynomial G(x); each gate of the third set having first and second sets of inputs respectively responsive to the outputs of register n·k and a feedback enabling signal, the feedback enabling signal controlling encoding and decoding of a message, the gates of the third group having outputs respectively supplied to the first inputs of the first adder; the logic means further including a tri-state gate having a set of inputs respectively responsive to outputs of the last register of the last assembly, the tri-state gate supplying an output circuit of the system with either the symbols of a checkword to be added to a message to be coded or the symbols of a possible error configuration during the decoding of a message, and means for controlling the state of the tri-state gate in response to an enabling signal.

5. The system of claim 4 further including plural detection means respectively having inputs responsive to the outputs of the first register of each assembly to detect the presence of a possible error syndrome in a decoded message, the error syndrome being formed of all the syndromes existing in each of the sub-blocks.

6. The system of claim 5 further including syndrome detection means for decoding the potential error syndrome, the decoding means decoding the error syndrome sub-block by sub-block, the error syndrome being formed of all of the syndromes in the various sub-blocks.

7. The system of claim 6 wherein the means for detecting the error syndrome comprises an error configuration recording table responsive to error indicating output signals of the error syndrome detection means, and indicator means responsive to outputs of the table for indicating the presence of: (a) errors in the entire data block, and (b) the presence of single errors and of multiple errors in each of the data sub-blocks, a counter loaded by the error indications and stepped by clock pulses in such a way as to identify the position of each symbol in the message containing an error and so as to extract, one by one, from register n·k symbols which respectively represent the error configurations in those symbols in the message which contain errors, said indicator comprising a logic network for loading a memory so the memory can store any potential grouped single or double errors in each sub-block.

8. The system of claim 7 further including a memory responsive to the logic network for storing an error table containing the position and the error configurations of each error containing symbol in the message.

9. The system of claim 7 further including a buffer memory for storing each data block of a message to be decoded, the useful symbols of the message being associated with symbols which form a checkword, means responsive to the indicator indicating (a) that no errors are detected during decoding for directly transmitting the useful symbols to a user, and (b) that errors are detected during decoding for activating the error table so the erroneous symbols are corrected by masking in a buffer memory before they are transmitted to a user.

10. The system of claim 9 wherein the detection means comprises a separate OR gate responsive to the contents of each first register of each assembly, each OR gate having an output coupled to an input of the error configuration recording table.

11. In an apparatus for coding or decoding an interleaved Reed-Solomon cyclically coded binary message including a sub-block of sequential data symbols each having D data bits, the number of sub-blocks corresponding to an interleaving depth k of the code, the code being represented by a polynomial $G(x)=Ax^n+Bx^{n-1}+\ldots+Nx+1$, comprising (n+1) cascaded registers, each of the (n+1)k registers having D parallel input and output bits, first circuit means for supplying the data bits to the registers, means for shifting bits in one register from the output of that register to the input of the adjacent register, second circuit means for non-linearly combining the D output bits of register k of several different assemblies to derive plural different sets of resultant bits, each set of resultant bits including D bits and being applied as D parallel input bits to a first register of a different register assembly, the second circuit means including signal multiplication means for multiplying the D output bits of register k of the several different assemblies by factors dependent on the coefficients A, B ... D of G(x).

12. The apparatus of claim 11 further including means responsive to the contents of one register in each assembly for detecting a predetermined combination of bits therein and for deriving a signal in response to the predetermined combination being detected, and means responsive to the signals derived by the detecting means for signaling an error in the message.

13. The apparatus of claim 11 wherein the second circuit means includes 1, 2 ... n EXCLUSIVE OR means each having a first input respectively responsive to the output of register k of assemblies 1, 2 ... n and an output coupled to the input of the first register of assemblies 2, 3 ... (n+1), the n EXCLUSIVE OR means having second inputs responsive to the output of assembly (n+1) as modified by the multiplication means.

14. The apparatus of claim 12 wherein the error signaling means includes means responsive to different combinations of signals derived by the detecting means for indicating whether there is one error or plural errors in each sub-block.

15. The apparatus of claim 14 further including counter means stepped in synchronism with shifting of data bits between the registers and responsive to the error signaling means for deriving an indication of the position of erroneous bytes in the message, and means responsive to the position indications derived by the counter means for extracting from the register assembly erroneous data bytes.

16. The apparatus of claim 11 wherein the code is susceptible to being represented by G(x) or $G_1(x)=A_1x^m+B_1x^{m-1}+\ldots Mx+1$, the second circuit means including second means for multiplying the D output bits of register k of the several different assemblies by factors dependent on the coefficients $A_1$, $B_1$ ... M of $G_1(x)$, and means for selectively connecting the signal multiplying means or the second means for multiplying in the circuit means.

17. A feedback shift register comprising a ring of N cascaded register stages each having D bits, where N and D are both integers greater than one, binary value multiplication means for respectively multiplying the D bits of a first of the stages by D binary values representing a coefficient other than one or zero, modulo two adder means between at least one adjacent pair of the stages, the modulo two adder means having first and second inputs respectively responsive to the D bits of one of the adjacent stages and to the D bits of the first of the stages as modified in the multiplication means by the binary value representing the coefficient, the modulo two adder means supplying D bits resulting from modulo two addition of the first and second inputs thereof to the other of the adjacent stages, the one adjacent stage being different from the first of the stages.

18. The register of claim 17 wherein N is divisible by M with no remainder, where M is a positive integer, said modulo two adder means including N/M sets of modulo two adders between N/M adjacent pairs of the stages, where N/M is a positive integer greater than one.

19. The register of claim 18 wherein M is an integer greater than one and (M−1) of said stages are cascaded to be responsive to a replica of the preceeding stage and every Mth stage is responsive to a modulo two adder.

20. The register of claim 18 further including means for selectively changing the values of the coefficients.

21. The register of claim 16 further including means for selectively changing the value of the coefficient.

22. In a system for detecting or correcting transmission errors in a message processed according to an interleaved cyclic code of the Reed-Solomon type and comprising at least one sub-block of symbols, each sub-block being constituted by the same number of data bits, the number of symbols in each sub-block corresponding to the interleaving depth of the code, the system comprising:
successive cascaded assemblies, each having a number of shift registers equal to the interleaving depth of the code, the number of the assemblies depending on the degree of the polynomial generator of the chosen cyclic code,
feedback circuits connected between the outputs and the inputs of the registers so as to multiply the message by the coefficients of the polynomial generator, said coefficients being obtained from the primitive elements of a predetermined Galois field, and
means for detecting the syndrome of eventual errors in the message, said detecting means having inputs connected to outputs of each first register of each assembly, the syndrome of errors being constituted by the set of syndromes of each of sub-blocks.

23. The system of claim 22 further comprising means for decoding the syndrome of eventual errors, said decoding means being connected to said syndrome detecting means, the decoding of the syndrome being made sub-block by sub-block.

24. The system of claim 23 wherein said syndrome detecting means comprises a memory for configuration of errors, said memory being connected to the different syndrome detection means, and means connected to outputs of the memory for indicating the existence of errors in a whole block of sub-blocks of data bits and, among these errors, the existence of a single error or multiple errors in each sub-block.

25. The system of claim 24 wherein the indication means is connected to a counter connected to receive output pulses of a clock controlling the shifting of the registers for localizing the position of each message symbol containing errors, and for extracting the symbols respectively representing the configurations of eventual errors in the symbols, the extraction being controlled by an extraction and reset signal, the indicating means comprising logical means for registering the eventual single or multiple grouped errors in each sub-block.

26. The system of claim 25, further comprising another memory connected to the outputs of the last register of the last assembly for registering the positions of the symbols having errors.

27. The system of claim 26, further comprising a buffer memory for registering each block of data bits of a message to be decoded, the useful symbols being appended to symbols constituting a checkword for enabling the useful symbols to be directly transmitted to a user when no error is detected, and the content of the said other memory enables the correction by masking, in the buffer memory of the symbols which comprise errors, before the transmission to a user, when errors are detected.

28. The system of claim 27 wherein the means for detecting the syndrome of errors comprises, for each first register of each assembly, an "OR" gate having first inputs connected to outputs of said first register and an output connected to an input of the memory registering the configuration of errors.

29. The system of claim 24, further comprising another memory connected to the outputs of the last register of the last assembly for registering the positions of the symbols having errors.

* * * * *